United States Patent
Chen et al.

(10) Patent No.: US 9,245,590 B2
(45) Date of Patent: Jan. 26, 2016

(54) STACKED DIE FLASH MEMORY DEVICE WITH SERIAL PERIPHERAL INTERFACE

(71) Applicant: Winbond Electronics Corporation, Taichung (TW)

(72) Inventors: Hui Chen, San Ramon, CA (US); Teng Su, Milpitas, CA (US)

(73) Assignee: Winbond Electronics Corporation, Taichung (TW)

( * ) Notice: Subject to any disclaimer, the term of this patent is extended or adjusted under 35 U.S.C. 154(b) by 147 days.

(21) Appl. No.: 14/194,248

(22) Filed: Feb. 28, 2014

(65) Prior Publication Data

US 2015/0248921 A1    Sep. 3, 2015

(51) Int. Cl.
G11C 16/10    (2006.01)
G11C 5/06    (2006.01)

(52) U.S. Cl.
CPC .............. G11C 5/063 (2013.01); G11C 16/107 (2013.01)

(58) Field of Classification Search
None
See application file for complete search history.

(56) References Cited

U.S. PATENT DOCUMENTS

| | | | |
|---|---|---|---|
| 6,366,487 B1 | 4/2002 | Yeom | |
| 7,088,132 B1 * | 8/2006 | Tang | H03K 19/17744 326/39 |
| 7,558,900 B2 | 7/2009 | Jigour et al. | |
| 9,082,469 B2 | 7/2015 | Ogawa et al. | |
| 2003/0123287 A1 | 7/2003 | Gorobets | |
| 2006/0212693 A1 | 9/2006 | Cho et al. | |
| 2008/0082735 A1 | 4/2008 | Shiga | |
| 2011/0195529 A1 | 8/2011 | Wu | |
| 2012/0084491 A1 | 4/2012 | Park et al. | |
| 2015/0186067 A1 * | 7/2015 | Shu | G06F 3/0688 711/103 |

OTHER PUBLICATIONS

Gupta, Anil. New Architecture for Code-Shadowing Applications, Flash Memory Summit, Santa Clara, CA, Winbond Electronics Corporation, 2013. 14 Pages.
Micron Technology, Inc. Micron Serial NOR Flash Memory, N25Q512A 1,8V, Multiple I/O Serial Flash Memory, Sep. 2013. 91 Pages.
Spansion Inc. Data Sheet, S70FL256P 256-Mbit CMOS 3.0 Volt Flash Memory with 104-MHz SPI (Serial Peripheral Interface) Multi I/O Bus, Revision 05, Jan. 30, 2013. 19 Pages.
Toshiba America Electronic Components, Inc. NAND vs. NOR Flash Memory Technology Overview, Apr. 25, 2006. 4 Pages.
Winbond Electronics Corporation. W25Q128FV spiflash 3V 128M-Bit Serial Flash Memory with Dual/Quad SPI & QPI, Revision D, Oct. 1, 2012. 97 Pages.

(Continued)

Primary Examiner — Kevin Verbrugge
(74) Attorney, Agent, or Firm — David H. Carroll (57) ABSTRACT

Any number of Serial Peripheral Interface ("SPI") flash memory die may be stacked and packaged using any desired multi-chip packaging technique to realize any one or combination of various capabilities such as low per-bit cost, high density storage, code shadowing to RAM, and fast random access for "execute in place" applications, while preserving the advantages of the SPI interface. During device manufacture, each of the stacked die is assigned a unique identifier or "Die ID" relative to the other stacked die in the package. During normal operations, the unique Die IDs are used by a Die Select instruction to enable one of the stacked die to respond to subsequent instructions on the SPI interface, while disabling the other stacked die in the package from responding to subsequent instructions but for certain "Universal" instructions which include the Die Select instruction. Concurrent operations by the stacked die are supported.

13 Claims, 4 Drawing Sheets

(56) References Cited

OTHER PUBLICATIONS

Winbond Electronics Corporation. W25N01GV spiflash 3V 1G-Bit Serial SLC Nand Flash Memory with Dual/Quad SPI & Continuous Read, Revision B, Nov. 26, 2013. 69 Pages.

Winbond Electronics Corporation. W25Q256FV spiflash 3V 256M-Bit Serial Flash Memory with Dual/Quad SPI & OPI, Revision F, Oct. 16, 2013. 108 Pages.

* cited by examiner

STACKED DIE FLASH MEMORY DEVICE WITH SERIAL PERIPHERAL INTERFACE

BACKGROUND OF THE INVENTION

1. Field of the Invention

The present invention relates to flash memory, and more particularly to flash memory devices which use stacked memory die and the Serial Peripheral Interface ("SPI").

2. Description of Related Art

Serial flash memory has become a popular alternative to conventional parallel flash memory. Serial flash memory provides many advantages, including small footprint packaging, low pin-count, simplified printed circuit board layout, low power consumption, performance comparable to parallel flash memory, and reduced device and system-level costs. The Serial Peripheral Interface ("SPI") is widely used in serial flash memory, and devices which are configurable for single-bit SPI or multi-bit SPI, including multi-bit instruction and/or address input and multi-bit data output, have become particularly popular. The SPI interface has many advantages. Single-bit SPI allows for broad compatibility, while multi-bit SPI when combined with certain types of flash memory and high clock speeds allows for fast "code shadowing to RAM" and "execute in place" ("XIP") code storage applications. Additional information on single-bit and multi-bit SPI may be found in, for example, U.S. Pat. No. 7,558,900 issued Jul. 7, 2009 to Jigour et al., and in various publications by Winbond Electronics Corporation, including Winbond Electronics Corporation, W25Q256FV: spiflash 3V 256M-Bit Serial Flash Memory with Dual/Quad SPI & QPI, Revision F, Hsinchu, Taiwan, R.O.C., Oct. 16, 2013; and Winbond Electronics Corporation, W25N01 GV: spiflash 3V 1 G-Bit Serial SLC NAND Flash Memory with Dual/Quad SPI & Continuous Read, Preliminary—Revision B, Hsinchu, Taiwan, R.O.C., Nov. 26, 2013.

Serial flash memories typically are offered in densities from 512 Kilobit to 1 Gigabit. However, the demand for higher density serial flash devices at lower per-bit cost keeps increasing. Monolithic silicon die at high density is feasible but costly. Stacking of lower density die of the same type to form a high density serial flash memory device is an alternative. With a density of 256 Mb for a single die, for example, two serial flash memory die of the same type have been stacked to achieve a 512 Mb (2×256 Mb) device, and four serial flash memory die of the same type have been stacked to achieve a 1 Gb (4×256 Mb) device.

Moreover, flash memory die of different types has been stacked to achieve a single memory device having different characteristics. Flash memory typically is NOR-type or NAND-type. In NOR-type flash memory, each memory cell is connected between a bit line and ground. The typical characteristics of NOR flash are low density, high read speed, slow write speed, slow erase speed, and random access. Since NOR flash has fast random-access memory read, microprocessors generally can use NOR flash memory for fast "code shadowing to RAM" and "execute in place" applications. In NAND-type flash memory, a number of memory cells are connected in series between a bit line and ground. The typical characteristics of NAND flash are high density, medium read speed, high page write speed, high erase speed, and an indirect or I/O like access. NAND-type flash memory is particularly well suited to systems requiring high-capacity data storage because of its high speed sequential writing capability and high density at low cost. Some types of NAND-type flash memory have been modified to provide sufficient SPI-NOR like performance in code shadowing applications. Further information on the stacking of NOR die and NAND die, and the stacking of a performance-enhanced NAND die and a NAND die, are described in United States Patent Application Publication No. US 2012/0084491 published Apr. 5, 2012, in the name of Eungjoon Park et al.

The techniques to operate a flash memory device having stacked SPI flash memory die are not entirely satisfactory. In one stacking approach disclosed in Spansion Inc., Data Sheet, S70FL256P 256-Mbit CMOS 3.0 Volt Flash Memory with 104-MHz SPI Multi I/O Bus, Revision 05, Jan. 30, 2013, two identical 128 Mb dies are stacked with their individual /CS inputs bonded to respective pins of the package to form the flash memory device. Disadvantageously, the controller is required to provide and manage multiple /CS control signals. Moreover, the dedication of two pins of an 8-pin package for chip select precludes one of the pins needed for the Quad SPI interface, thereby eliminating Quad SPI in an 8-pin package.

In another stacking approach disclosed in Micron Technology Inc., N25Q512A 1.8V, Multiple I/O Serial Flash Memory, September 2013, two dissimilar die are stacked and from a user standpoint behave as a monolithic device, except with regard to READ MEMORY and ERASE operations and status polling. While such a device can operate with a Quad I/O SPI protocol in an 8-pin package, the manufacturing costs tend to be greater due to the complexity of the special design.

BRIEF SUMMARY OF THE INVENTION

What is needed is a single flash memory device solution that maintains the advantages of SPI flash memory while providing higher capacity data storage alone with, in some embodiments, execute-in-place and code shadowing to RAM. The present invention includes the following illustrative embodiments.

One embodiment of the present invention is a flash memory device comprising: a first Serial Peripheral Interface ("SPI") flash memory die comprising a first die identifier and a first set of SPI-compliant interface pins; a second SPI flash memory die comprising a second die identifier and a second set of SPI-compliant interface pins; and a package containing the first SPI flash memory die and the second SPI flash memory die in a stacked arrangement, and having a set of SPI-compliant package pins coupled in parallel to the first and second set of SPI-compliant interface pins.

Another embodiment of the present invention is a method of performing concurrent operations in a Serial Peripheral Interface ("SPI") flash memory device having a set of SPI-compliant device pins which include a chip select pin. A SPI flash memory device suitable in the method comprises a first SPI flash memory die having a first die identifier and a first set of SPI-compliant pins; and a second SPI flash memory die having a second die identifier and a second set of SPI-compliant pins; the first SPI flash memory die and the second SPI flash memory die being stacked, and the first and second set of SPI-compliant pins being coupled in parallel to the SPI-compliant device pins. The method comprises receiving a first chip select active signal at the chip select pin of the SPI flash memory device, the first chip select active signal being applied in parallel to the first SPI flash memory die and the second SPI flash memory die; and in conjunction with the first chip select active signal receiving step, executing on the first and second SPI flash memory devices a first Die Select instruction specifying a first Die ID to the SPI flash memory device, to enable the first SPI flash memory die to respond to a SPI instruction set, and to disable the second SPI flash memory die from responding to the SPI instruction set while enabling the second SPI flash memory die to respond to a Universal instruction subset, the Universal instruction subset being a subset of the SPI instruction set and including a Die Select instruction. The method further comprises receiving a first chip select inactive signal at the chip select pin of the SPI flash memory device to terminate execution of the first Die Select instruction on the first and second SPI flash memory devices. The method further comprises, while the first SPI flash memory die is enabled to respond to the SPI instruction set, receiving a second chip select active signal at the chip select pin of the SPI flash memory device, the second chip select active signal being applied in parallel to the first SPI flash memory die and the second SPI flash memory die; and in conjunction with the second chip select active signal receiving step, executing on the first SPI flash memory die a first SPI instruction other than a Universal instruction and which entails an internal self-timed operation. The method further comprises receiving a second chip select inactive signal at the chip select pin of the SPI flash memory device to terminate the first SPI instruction on the first SPI flash memory device without terminating the internal self-timed operation. The method further comprises receiving a third chip select active signal at the chip select pin of the SPI flash memory device, the third chip select active signal being applied in parallel to the first SPI flash memory die and the second SPI flash memory die; and in conjunction with the third chip select active signal receiving step, executing on the first and second SPI flash memory devices a second Die Select instruction specifying a second Die ID to the SPI flash memory device, to enable the second SPI flash memory die to respond to the SPI instruction set, and to disable the first SPI flash memory die from responding to the SPI instruction set while enabling the first SPI flash memory die to respond to the Universal instruction subset. The method further comprises receiving a third chip select inactive signal at the chip select pin of the SPI flash memory device to terminate the second Die Select instruction. The method further comprises, while the second SPI flash memory die is enabled to respond to the SPI instruction set, receiving a fourth chip select active signal at the chip select pin of the SPI flash memory device, the fourth chip select active signal being applied in parallel to the first SPI flash memory die and the second SPI flash memory die; and in conjunction with the fourth chip select active signal receiving step, executing on the second SPI flash memory die a second SPI instruction, concurrently with the internal self-timed operation executing on the first SPI flash memory die. The method further comprises receiving a fourth chip select inactive signal at the chip select pin of the SPI flash memory device to terminate the second SPI instruction.

DETAILED DESCRIPTION OF THE INVENTION, INCLUDING THE BEST MODE

Any number of Serial Peripheral Interface ("SPI") flash memory die may be stacked and packaged using any desired multi-chip packaging technique to realize any one or combination of various capabilities such as low per-bit cost, high density storage, code shadowing to RAM, and fast random access for "execute in place" applications, while preserving the advantages of the SPI interface. As used herein, the term "SPI flash memory die" refers to an integrated circuit die which includes a flash memory array of any type or types, and a set of interface pins which conform to the SPI protocol. During device manufacture, each of the stacked SPI flash memory die is assigned a unique identifier or "Die ID" relative to the other stacked SPI flash memory die in the package. During normal operations, the unique Die IDs are used by a Die Select instruction to enable one of the stacked SPI flash memory die to respond to subsequent instructions on the SPI interface, while disabling the other stacked SPI flash memory die in the package from responding to subsequent instructions but for certain "Universal" instructions, which include the Die Select instruction.

As used herein, the term "pin" refers to an conductive element used for direct or indirect external electrical contact to a serial flash memory die, whether a conductive element on a die such as a bonding pad, a conductive element mounted in or on a package including recessed contacts, flush contacts, projecting contacts such as prongs and BGA balls, and so forth.

As used herein, the term "SPI-compliant pins" refers to a set of pins which is compliant with the SPI protocol. In accordance with the SPI protocol, six pins may be configurable as single SPI, dual SPI, quad SPI, and Quad Peripheral Interface ("QPI") (also known as Serial Quad Interface, or "SQI"), and including single-bit or multi-bit instruction and/or address input and single-bit or multi-bit data input and/or output, although configurability may be limited to any desired subset of these configurations. The six pins provided may be chip select /CS, clock CLK, configurable pin DI($IO_0$), configurable pin DO($IO_1$), configurable pin /WP($IO_2$), and configurable pin /HOLD($IO_3$). For single-bit SPI operation, the configurable pins may be configured as instruction/address/data input DI, data output DO, write protect bar /WP, and hold bar /HOLD. For dual SPI, the configurable pins may be configured as input/output IO0, input/output IO1, write protect bar /WP, and hold bar /HOLD. For quad SPI and QPI, the configurable pins may be configured as input/output IO0, input/output IO1, input/output IO2, and input/output IO3.

Operations which do not entail conflicting bus accesses may be executed concurrently on different SPI flash memory die. Many operations are initiated by instructions (opcodes with or without addresses) input over the SPI bus, but thereafter proceed as self-timed operations under control of an internal control circuit, and may be from milliseconds to seconds in duration. Examples of such operations include Memory Array Program, Erase, Write Status Registers, and Program/Erase Security Registers. The execution of these instructions involves internal operations which do not entail any bus access, so these operations are suitable for running concurrently with other similar operations as well operations which do require bus access. Examples of operations which use the SPI bus even after the instruction is issued to communicate data include memory array read, status read, device ID read, SFDP read, security register read, cache load (NAND), and the initial part of memory program (NOR).

Figure 1:
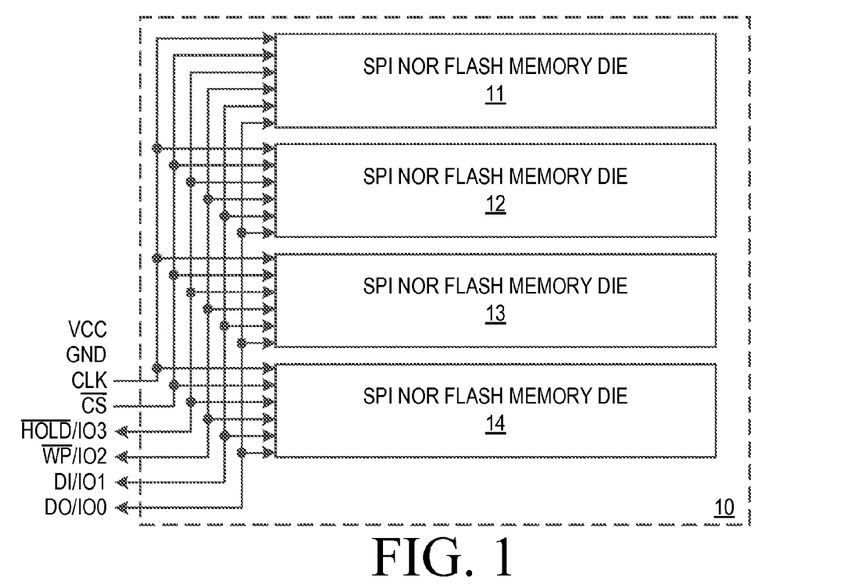
FIG. 1 is a schematic block diagram of an illustrative implementation of a SPI flash memory device having stacked SPI flash memory die.

The stacked SPI flash memory die may all be of the same type to achieve a higher memory density. FIG. 1 shows an SPI flash memory device 10 which includes four stacked SPI-NOR flash memory die 11, 12, 13 and 14 of the same type. An example of a suitable type of SPI-NOR flash memory die is the type used in product number W25Q256FV by Winbond Electronics Corporation of Hsinchu, Taiwan, R.O.C.; see Winbond Electronics Corporation, W25Q256FV: spiflash 3V 256M-Bit Serial Flash Memory with Dual/Quad SPI & QPI, Revision F, Hsinchu, Taiwan, R.O.C., Oct. 16, 2013, which hereby is incorporated herein in its entirety by reference thereto, and which may be suitably modified to include a Die ID and a command and control logic modified to process the Die Select instruction. Other types of SPI flash memory die may be used, such as four stacked SPI-NAND flash memory die such as the type used in product number W25N01GV by Winbond Electronics Corporation of Hsinchu, Taiwan, R.O.C.; see Winbond Electronics Corporation, W25N01GV: spiflash 3V 1 G-Bit Serial SLC NAND Flash Memory with Dual/Quad SPI & Continuous Read, Preliminary—Revision B, Hsinchu, Taiwan, R.O.C., Nov. 26, 2013, which hereby is incorporated herein in its entirety by reference thereto, and which may be suitably modified to include a Die ID and a command and control logic modified to process the Die Select instruction. Other types of SPI-NOR and SPI-NAND flash memory die may be used, as desired. While four stacked die are shown in FIG. 1, as few as two SPI flash memory die may be stacked to advantage, and more generally, any number may be used. While using a power of two may be convenient, the number of SPI flash memory die need not be to the power of two.

Each of the SPI flash memory die 11, 12, 13 and 14 is an SPI protocol flash memory die having six interface pins conforming to the SPI protocol in addition to two pins for power ("VCC") and ground ("GND") respectively, for a total of eight pins.

Figure 2:
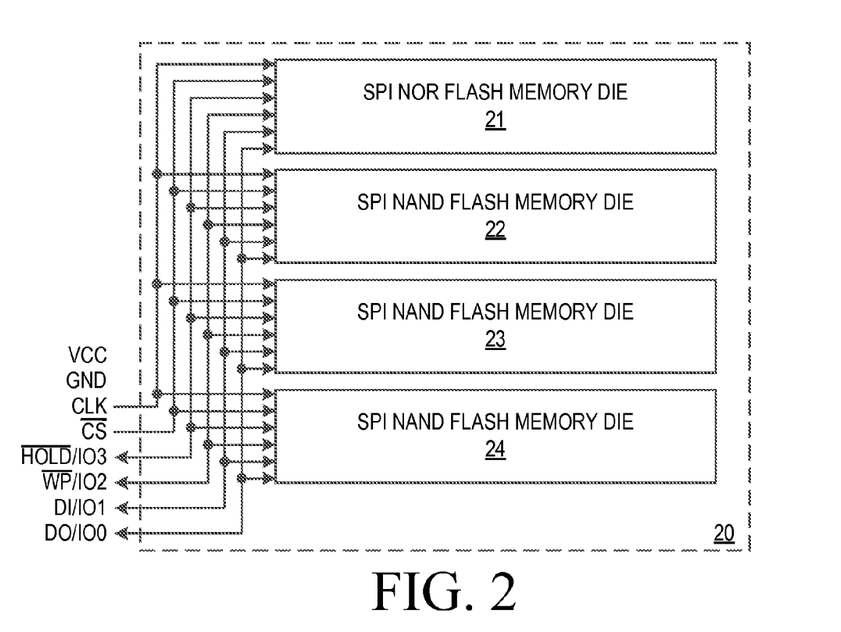
FIG. 2 is a schematic block diagram of another illustrative implementation of a SPI flash memory device having stacked SPI flash memory die.

The stacked die need not be all of the same type, but instead may be selected for their different capabilities and characteristics so that the stacked memory device may offer combinations of capabilities that are particularly suitable for certain applications. FIG. 2 shows a SPI flash memory device 20 which includes a SPI-NOR flash memory die 21, which is particularly suitable for code applications such as execute-in-place and code shadowing, stacked along with three SPI-NAND flash memory die 22, 23 and 24, which are particularly suitable for data storage and in combination offer very high density. The SPI flash memory die 21, 22, 23 and 24 include respective Die IDs and modified command and control logic for responding to the Die Select instruction. If more fast random access memory is desired, two SPI-NOR flash memory die may be stacked with two SPI-NAND flash memory die, or additional SPI-NOR flash memory die may be added to the stack. A SPI-NAND flash memory die (not shown) suitably optimized for code storage applications may be substituted for the SPI-NOR flash memory die 21. A suitable SPI-NAND flash memory is described in, for example, US Patent Application Publication No. US 2012/0084491 published Apr. 5, 2012 in the name of Eungjoon Park et al., which hereby is incorporated herein in its entirety by reference thereto. The size of the memory arrays in the various die may be identical or different, or some may be identical and others different. In the device shown in FIG. 2, for example, the SPI NOR flash memory die 21 need not be large; illustratively 16-32 Mb may suffice for many common XIP and code shadowing applications, while the SPI NAND flash memory die may each be quite large, illustratively 1 Gb, to provide ample data storage for many common applications. These values are merely illustrative, and may increase as fabrication technology continues to evolve.

Each of the SPI flash memory die 21, 22, 23 and 24 is an SPI protocol flash memory die having six interface pins conforming to the SPI protocol, and two pins for power ("VCC") and ground ("GND") respectively, for a total of eight pins.

SPI flash memory devices using stacked SPI flash memory die may provide any one or any combination of two or more of the following benefits, possibly along with other benefits: (a) a single physical /CS pin for multiple stacked SPI flash memory die; (b) eight-pin package capable of implementing all SPI protocols, including the Quad SPI protocol; (c) concurrent execution of some SPI operations; (d) only minor modification of existing SPI flash memory die designs is needed; (e) conventional multi-chip packaging techniques are suitable; and (f) heterogeneous SPI flash memory die may be stacked to achieve multiple capabilities and performance goals.

Figure 3:
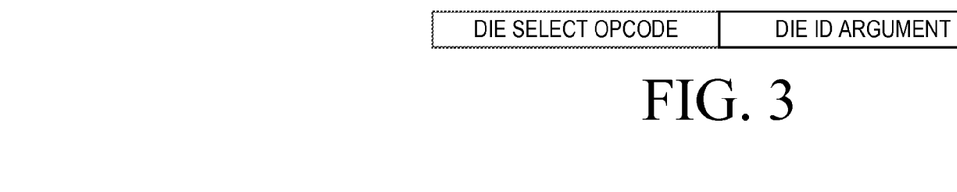
FIG. 3 is a schematic block diagram of a Die Select instruction.

The SPI flash memory device using stacked SPI flash memory die may be made compatible with traditional flash memory instruction sets, augmented by a "Die Select" instruction. Illustratively, as shown in FIG. 3, the Die Select instruction may be a two byte instruction such as a C2 hex opcode followed by an eight bit Die ID. While the number of bits needed depends on the maximum number of die that may be stacked within supported SPI flash memory devices, and while two bits are sufficient for up to four stacked die, eight bits are reserved for the Die ID so that the Die ID may end on a byte boundary as is customary for memory instructions.

The Die Select instruction functions in the following manner to select any individual SPI flash memory die in a multi-die stacked package. The Die Select instruction is issued by a controller (not shown) to the SPI flash memory device along with the unique Die ID of the particular die to which access is desired. All of the stacked die process the Die Select instruction. The die whose die identifier matches the Die ID argument of the Die Select instruction is enabled to respond to the entire SPI instruction set. The other die whose die identifier(s) do not match the Die ID argument of the Die Select instruction are enabled to respond to a subset of the SPI instruction set referred to herein as the Universal instruction subset, being otherwise made nonresponsive to the SPI instruction set. If support for concurrent operations is desired, the SPI command and control logic of the non-selected die may continue to execute any internal operation currently in progress. This capability may be designed into the SPI command and control logic of each of the stacked SPI flash memory die.

Figure 4:
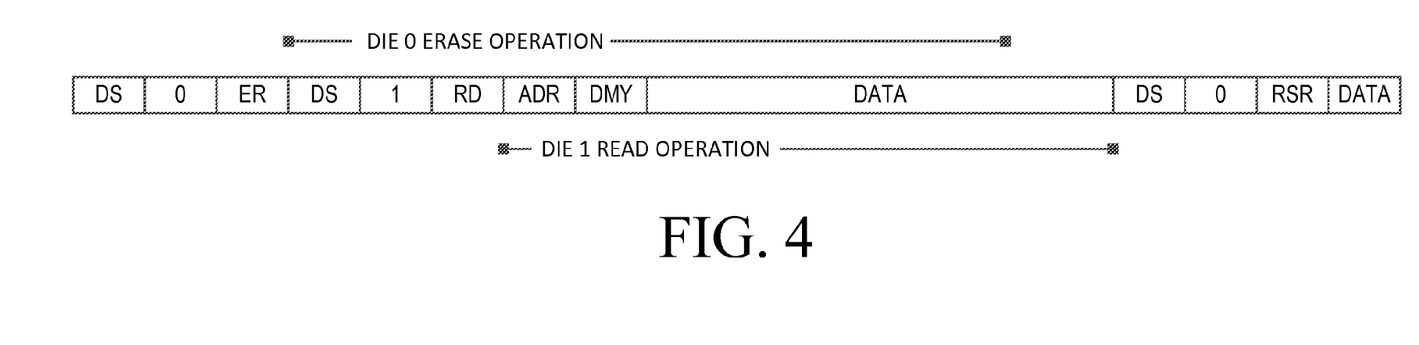
FIG. 4 is a schematic block diagram of an instruction sequence for implementing concurrent operations in a SPI flash memory device having stacked SPI flash memory die.
Figure 5:
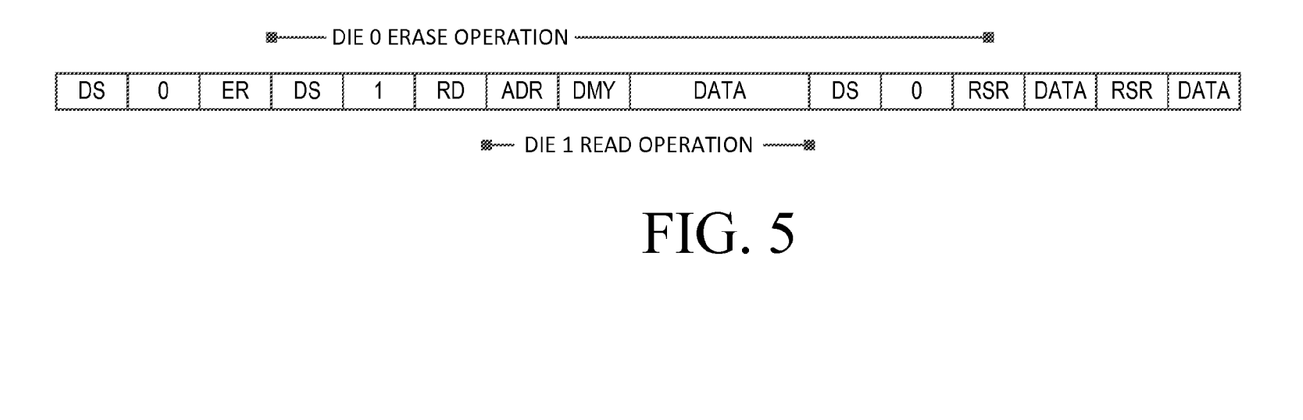
FIG. 5 is a schematic block diagram of another instruction sequence for implementing concurrent operations in a SPI flash memory device having stacked SPI flash memory die.

FIG. 4 and FIG. 5 are examples of one type of concurrent operation, namely concurrent erase and read. For clarity, various other signals commonly used during instruction sequences are omitted. Such signals include the /CS signal, which illustratively transitions low before each instruction to select the device and transitions high to complete the instruction while permitting internal erase, program, and write status register cycles to complete. The /CS signal may be used in this manner with the Die Select instruction.

The illustrative instruction sequence of FIG. 4 begins with a Die Select opcode ("DS") followed by Die ID 0 followed by an Erase opcode ("ER"), illustratively a Chip Erase instruction, which causes Die 0 to execute an internal self-timed erase operation upon transition of /CS from low to high. Next in the instruction sequence is a Die Select opcode ("DS") followed by Die ID 1 followed by a Read opcode ("RD") and any associated address bits "ADR" and dummy bits "DMY," which causes Die 1 to execute a read operation. The read operation illustratively is preceded by a transition of /CS from high to low, and completes upon transition of /CS from low to high. In this example, the read operation is longer in duration than the erase operation. Next in the instruction sequence is a Die Select opcode ("DS") followed by Die ID 0 followed by a Read Status Register # opcode ("RSR") for checking data in a status register, such as the BUSY bit SO in Status Register 1, to determine whether the erase operation has completed. The BUSY bit illustratively is a read-only bit that is set to a 1 state when the SPI flash memory die is executing an internal erase, program, or write status register cycle. While some controllers use a timer to make this determination, in this example the Read Status Register opcode is used. Die 0 responds with Data from the status register to indicate that the erase operation is no longer being executed and Die 0 is ready for other operations.

The illustrative instruction sequence of FIG. 5 begins with a Die Select opcode ("DS") followed by Die ID 0 followed by an Erase opcode ("ER"), illustratively a Chip Erase instruction, which causes Die 0 to execute an internal self-timed erase operation upon transition of /CS from low to high. Next in the instruction sequence is a Die Select opcode ("DS") followed by Die ID 1 followed by a Read opcode ("RD") and any associated address bits "ADR" and dummy bits "DMY," which causes Die 1 to execute a read operation. The read operation illustratively is preceded by a transition of /CS from high to low, and completes upon transition of /CS from low to high. In this example, the read operation is shorter in duration than the erase operation and completes before the erase operation completes. Next in the instruction sequence is a Die Select opcode ("DS") followed by Die ID 0 followed by a Read Status Register opcode ("RSR") for checking data in a status register, such as the BUSY bit SO in Status Register 1, to determine whether the erase operation has completed. Die 0 is responsive to the Die Select instruction and becomes the selected die, even though an internal erase operation is still executing. Die 0 responds with Data from the status register to indicate that the erase operation is still executing. Next in the instruction sequence is another Read Status Register opcode ("RSR") for again checking data in the status register. This time Die 0 responds with Data from the status register to indicate that the erase operation is no longer being executed and Die 0 is ready for other operations.

Figure 6:
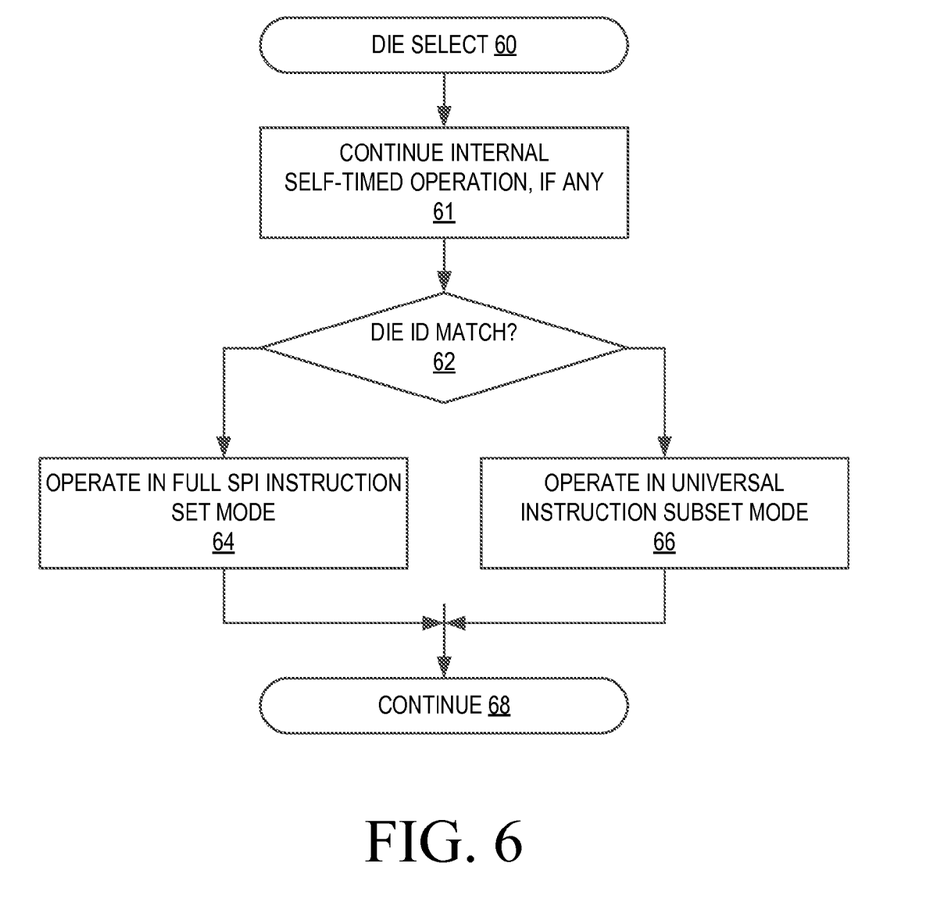
FIG. 6 is a flowchart showing operation of a SPI flash memory die in response to a Die Select instruction.

FIG. 6 is a flowchart 60 showing the processing by the command and control logic of the Die Select instruction. Receipt of the Die Select instruction does not disturb any internal self-timed operation that is in progress (block 61). Upon receipt of the Die Select instruction, the Die ID of the SPI flash memory die is compared to the Die ID provided in the Die Select instruction (block 62). If a match is detected, the SPI flash memory die is placed into, or remains in, the full SPI instruction execution mode (block 64), which is the standard mode in which the die is responsive to all of the instructions in the full SPI instruction set. If a match is not detected, the SPI flash memory die is placed into, or remains in, the Universal instruction execution mode (block 66). The Universal instruction execution mode is a new mode in which the SPI flash memory die is responsive to Universal instructions. As used herein, the term "Universal instructions" refers to a subset of the SPI instruction set to which a SPI flash memory die should be responsive regardless of whether the die is enabled for responding to the full SPI instruction set, and includes the Die Select instruction and some standard instructions such as Device Reset. The command and control logic may be implemented in any desired manner, such as in hardware, firmware, software, as a state machine, any combination of the foregoing, or in any other manner.

Many different types of concurrent operations are possible using stacked SPI flash memory die. Due to the time required for an internal erase, program and write operations in flash memory, the ability to have the stacked SPI flash memory die respectively executing different instructions may advantageously increase data throughput during normal operation and facilitate efficient "code-downloading" during system manufacturing. Particularly useful examples of concurrent operations are "Read while Write" (status register writes, whether 0 to 1 or 1 to 0), "Read while Program/Erase" (excluding the data transfer portion of the SPI-NOR Program instruction), and "Multi-die Program/Erase" (excluding the data transfer portion of the SPI-NOR Program instruction). While two concurrent operations are described herein for purposes of illustration, the number of current operations may be as great as the number of stacked SPI flash memory die. Each of the stacked SPI flash memory die may be enabled separately by the Die Select instruction and execute a status register read to check its status, illustratively whether it is busy performing a write, program or erase operation and unable to accept new instructions, or is available to accept new instructions.

At power up, and if desired, one particular die, illustratively the die having the Die ID of "00," may by default be designated as the active die. Prior to normal operations, Serial Flash Discoverable Parameters ("SFDP") instruction may be used to identify whether the SPI flash memory device has stacked die and the software "Die Select" feature. A vendor-specific SFDP header may be appended to the main SFDP table for this purpose.

The unique die identifiers illustratively are assigned during the manufacturing process using any desired technique. One illustrative technique involves providing a desired number of Die ID bits in a register, and pre-programming those bits as part of the manufacturing process and prior to stacking. This technique advantageously has essentially no space penalty since the register bits are small. However, if this technique is used, care should be taken while selecting die for stacking to ensure that the pre-programmed Die ID bits of the selected die are all unique to the stack and in proper sequence. Another illustrative technique involves providing each of the SPI flash memory die with Die ID pins, illustratively bonding pads, and illustratively wire-bonding these pads to VCC or GND as appropriate to establish unique Die IDs for the SPI flash memory die in the stack. Where Die ID register bits are provided, the Die ID pins may be used as logical inputs to the Die ID register bits through respective transfer gates. Advantageously, the risk of error in assigning the Die IDs when using bonding pads is low, although the Die ID pins impose a space penalty, especially if they are bonding pads.

While stacked SPI flash memory die may be placed in packages which have more than eight pins, and while the techniques described in this patent document may be combined with other techniques which make use of some or all of the additional pins, advantageously the techniques described herein enable the stacking of numerous SPI flash memory die within a simple and very small footprint eight pin package. Eight-pin packages such as Small Outline Integrated Circuit ("SOIC") type and the Very Very Thin Small Outline No Lead ("WSON") type remain popular choices for serial flash memory devices due to their small footprint in a system printed circuit board layout.

Figure 7:
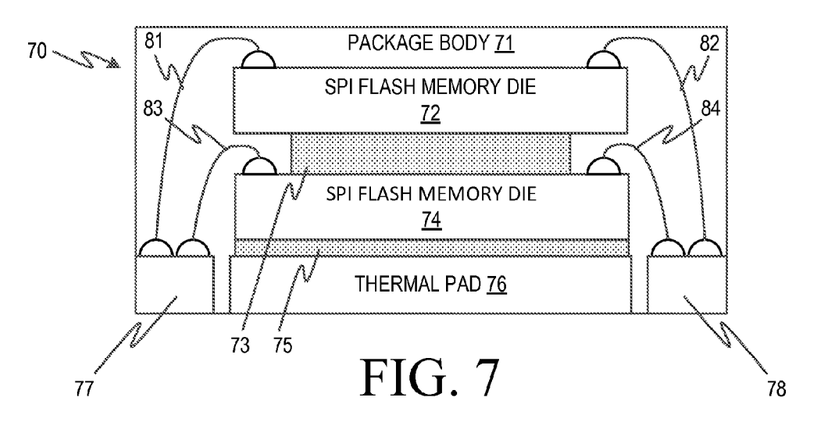
FIG. 7 is a side plan view of a type of a die stacking technique which uses spacers between die.

FIG. 7 is a side plan view of an illustrative eight-pin WSON type SPI flash memory device 70 which contains two stacked SPI flash memory die 72 and 74 within a package body 71. While any suitable stacking technique may be used, the SPI flash memory device 70 uses a spacer body 73 to ensure adequate spacing between the bottom of the SPI flash memory die 72 and the wires and wire bonds (illustratively wires 83 and 84 and associate wire bonds) at the top of the SPI flash memory die 74. The spacer body may be of any suitable type, illustrative either a solid body of material with top and bottom adhesive faces, or a thick application of a viscous cement or other bonding material. The SPI flash memory die 74 is attached to a thermal pad 76 using any suitable technique, illustratively a cement 75 or other bonding material. The SPI flash memory die 72 is wire-bonded to various leads of a lead frame (wires 81, 82, 83 and 84 and associated wire bonds being illustrative). Various leads of the lead frame are exposed through the package body 71 (areas 77 and 78 being illustrative) to provide pads for connection to external circuitry.

Figure 8:
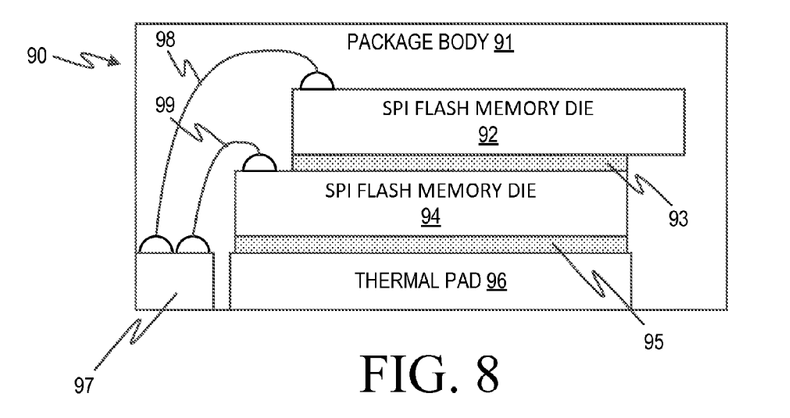
FIG. 8 is a side plan view of a type of a die stacking technique which uses die staggering.

FIG. 8 is a side plan view of an illustrative eight-pin WSON type SPI flash memory device 90 which contains two stacked SPI flash memory die 92 and 94 within a package body 91. The SPI flash memory device 90 uses a die offset technique to avoid interference between the bottom of the SPI flash memory die 92 and the wires and wire bonds (illustratively wire 99 and associated wire bond) at the top of the SPI flash memory die 94. The SPI flash memory die 92 and 94 are secured in the stack using any suitable material 93, illustratively a cement or a solid body of material with top and bottom adhesive faces. The SPI flash memory die 94 is attached to a thermal pad 96 using any suitable technique, illustratively a cement 95 or other bonding material. The SPI flash memory die 92 and 94 are wire-bonded to various leads of a lead frame (wires 98 and 99 and associated wire bonds being illustrative). Various leads of the lead frame are exposed through the package body 91 (area 97 being illustrative) to provide pads for connection to external circuitry.

Figure 9:
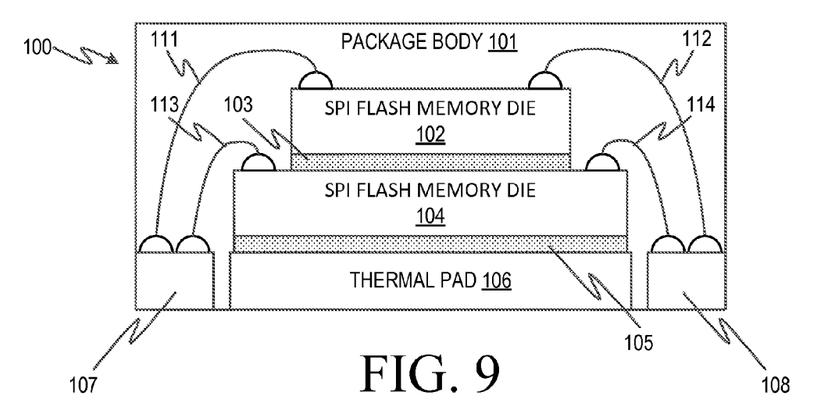
FIG. 9 is a side plan view of a type of a die stacking technique which uses different-sized dies.

FIG. 9 is a side plan view of an illustrative eight-pin WSON type SPI flash memory device 100 which contains two stacked SPI flash memory die 102 and 104 within a package body 101. While any suitable stacking technique may be used, the SPI flash memory device 100 uses die of different size or shape to avoid interference between the bottom of the SPI flash memory die 102 and the wires and wire bonds (illustratively wires 113 and 114 and associated wire bonds) at the top of the SPI flash memory die 104. The SPI flash memory die 102 and 104 are secured in the stack using any suitable material 103, illustratively a cement or a solid body of material with top and bottom adhesive faces. The SPI flash memory die 104 is attached to a thermal pad 106 using any suitable technique, illustratively a cement 105 or other bonding material. The SPI flash memory die 102 and 104 are wire-bonded to various leads of a lead frame (wires 111, 112, 113 and 114 and associated wire bonds being illustrative). Various leads of the lead frame are exposed through the package body 101 (areas 107 and 108 being illustrative) to provide pads for connection to external circuitry.

The stacking techniques described herein and other stacking techniques are not necessarily mutually exclusive, and two or more such techniques may be used to manufacture any particular stack. Various stacking techniques are widely disclosed in the art; see, for example, US Patent Application Publication No. US 2011/0195529 published Aug. 11, 2011 in the name of Wu, which hereby is incorporated herein in its entirety by reference thereto. Although wire bonds are shown in FIGS. 7-9, any other suitable wiring technique between die and with the package pins, such as vias, for example, may be used instead of or in combination with wire bonds.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A flash memory device comprising:
a first Serial Peripheral Interface ("SPI") flash memory die comprising a first die identifier and a first set of SPI-compliant interface pins;
a second SPI flash memory die comprising a second die identifier and a second set of SPI-compliant interface pins; and
a package containing the first SPI flash memory die and the second SPI flash memory die in a stacked arrangement, and having a set of SPI-compliant package pins coupled in parallel to the first and second set of SPI-compliant interface pins.

2. The flash memory device of claim 1 wherein:
the first SPI flash memory die comprises a first command and control logic configured to enable the first SPI flash memory die to be responsive to an SPI instruction set in response to a die select instruction specifying the first die identifier, to disable the first SPI flash memory die from being responsive to the SPI instruction set in response to a die select instruction not specifying the first die identifier, and to enable the first SPI flash memory die to be responsive to a Universal instruction subset of the SPI instruction set in response to a die select instruction not specifying the first die identifier; and
the second SPI flash memory die comprises a second command and control logic configured to enable the second SPI flash memory die to be responsive to the SPI instruction set in response to a die select instruction specifying the second die identifier, to disable the second SPI flash memory die from being responsive to the SPI instruction set in response to a die select instruction not specifying the second die identifier, and to enable the second SPI flash memory die to be responsive to the Universal instruction subset of the SPI instruction set in response to a die select instruction not specifying the second die identifier.

3. The flash memory device of claim 2 further comprising:
a plurality of first register bits on the first SPI flash memory die configured to store the first die identifier, the first command and control logic being coupled to the first register bits; and
a plurality of second register bits on the second SPI flash memory die configured to store the second die identifier, the second command and control logic being coupled to the second register bits.

4. The flash memory device of claim 1 wherein:
the first set of SPI-compliant interface pins consists of a first chip select /CS pin, a first clock CLK pin, a first configurable DI($IO_0$) pin, a first configurable DO($IO_1$) pin, a first configurable /WP($IO_2$) pin, and a first configurable /HOLD($IO_3$) pin;
the second set of SPI-compliant interface pins consists of a second chip select /CS pin, a second clock CLK pin, a second configurable DI($IO_0$) pin, a second configurable DO($IO_1$) pin, a second configurable /WP($IO_2$) pin, and a second configurable /HOLD($IO_3$) pin; and
the set of SPI-compliant package pins consists of a third chip select /CS pin connected to the first and second chip select /CS pins, a third clock CLK pin connected to the first and second clock CLK pins, a third configurable DI($IO_0$) pin connected to the first and second configurable DI($IO_0$) pins, a third configurable DO($IO_1$) pin connected to the first and second configurable DO($IO_1$) pins, a third configurable /WP($IO_2$) pin connected to the first and second configurable /WP($IO_2$) pins, and a third configurable /HOLD($IO_3$) pin connected to the first and second configurable /HOLD($IO_3$) pins.

5. The flash memory device of claim 1 wherein:
the first SPI flash memory die further comprises at least one die identifier pin coupled to ground to at least partially establish the first die identifier; and
the second SPI flash memory die further comprises at least one die identifier pin coupled to power to at least partially establish the second die identifier.

6. The flash memory device of claim 3 wherein:
the first SPI flash memory die further comprises at least one first transfer gate and at least one first die identifier pin coupled to at least one of the first register bits through the first transfer gate to at least partially establish the first die identifier; and
the second SPI flash memory die further comprises at least one second transfer gate and at least one second die identifier pin coupled to at least one of the second register bits through the second transfer gate to at least partially establish the second die identifier.

7. The flash memory device of claim 6 wherein:
the first die identifier pin is coupled to ground; and
the second die identifier pin is coupled to power.

8. The flash memory device of claim 1 further comprising:
a third SPI flash memory die comprising a third die identifier and a third set of SPI-compliant interface pins; and
a fourth SPI flash memory die comprising a fourth die identifier and a fourth set of SPI-compliant interface pins;
wherein the package further contains the third SPI flash memory die and the fourth SPI flash memory die in a stacked arrangement with the first SPI flash memory die and the second SPI flash memory die; and
wherein the set of SPI package pins is coupled in parallel to the first, second, third and fourth sets of SPI-compliant interface pins.

9. The flash memory device of claim 8 wherein:
the first SPI flash memory die further comprises two die identifier pins coupled to ground to establish the first die identifier;
the second SPI flash memory die further comprises two die identifier pins respectively coupled to ground and power to establish the second die identifier;
the third SPI flash memory die further comprises two die identifier pins respectively coupled to power and ground to establish the third die identifier; and the fourth SPI flash memory die further comprises two die identifier pins coupled to power to establish the fourth die identifier.

10. The flash memory device of claim 1 wherein:
the first SPI flash memory die comprises SPI-NOR flash memory; and
the second SPI flash memory die comprises SPI-NOR flash memory.

11. The flash memory device of claim 1 wherein:
the first SPI flash memory die comprises SPI-NAND flash memory; and
the second SPI flash memory die comprises SPI-NAND flash memory.

12. The flash memory device of claim 1 wherein:
the first SPI flash memory die comprises SPI-NOR flash memory; and
the second SPI flash memory die comprises SPI-NAND flash memory.

13. A method of performing concurrent operations in a Serial Peripheral Interface ("SPI") flash memory device having a set of SPI-compliant device pins which include a chip select pin, the method comprising:
receiving a first chip select active signal at the chip select pin of the SPI flash memory device, wherein the SPI flash memory device comprises:
a first SPI flash memory die having a first die identifier and a first set of SPI-compliant pins; and
a second SPI flash memory die having a second die identifier and a second set of SPI-compliant pins;
the first SPI flash memory die and the second SPI flash memory die being stacked, and the first and second set of SPI-compliant pins being coupled in parallel to the SPI-compliant device pins; and
the first chip select active signal being applied in parallel to the first SPI flash memory die and the second SPI flash memory die;
in conjunction with the first chip select active signal receiving step, executing on the first and second SPI flash memory dies a first Die Select instruction specifying a first Die ID to the SPI flash memory device, to enable the first SPI flash memory die to respond to a SPI instruction set, and to disable the second SPI flash memory die from responding to the SPI instruction set while enabling the second SPI flash memory die to respond to a Universal instruction subset, the Universal instruction subset being a subset of the SPI instruction set and including a Die Select instruction;
receiving a first chip select inactive signal at the chip select pin of the SPI flash memory device to terminate execution of the first Die Select instruction on the first and second SPI flash memory dies;
while the first SPI flash memory die is enabled to respond to the SPI instruction set, receiving a second chip select active signal at the chip select pin of the SPI flash memory device, the second chip select active signal being applied in parallel to the first SPI flash memory die and the second SPI flash memory die;
in conjunction with the second chip select active signal receiving step, executing on the first SPI flash memory die a first SPI instruction other than a Universal instruction and which entails an internal self-timed operation;
receiving a second chip select inactive signal at the chip select pin of the SPI flash memory device to terminate the first SPI instruction on the first SPI flash memory die without terminating the internal self-timed operation;
receiving a third chip select active signal at the chip select pin of the SPI flash memory device, the third chip select active signal being applied in parallel to the first SPI flash memory die and the second SPI flash memory die;

in conjunction with the third chip select active signal receiving step, executing on the first and second SPI flash memory dies a second Die Select instruction specifying a second Die ID to the SPI flash memory device, to enable the second SPI flash memory die to respond to the SPI instruction set, and to disable the first SPI flash memory die from responding to the SPI instruction set while enabling the first SPI flash memory die to respond to the Universal instruction subset;

receiving a third chip select inactive signal at the chip select pin of the SPI flash memory device to terminate the second Die Select instruction;

while the second SPI flash memory die is enabled to respond to the SPI instruction set, receiving a fourth chip select active signal at the chip select pin of the SPI flash memory device, the fourth chip select active signal being applied in parallel to the first SPI flash memory die and the second SPI flash memory die;

in conjunction with the fourth chip select active signal receiving step, executing on the second SPI flash memory die a second SPI instruction, concurrently with the internal self-timed operation executing on the first SPI flash memory die; and receiving a fourth chip select inactive signal at the chip select pin of the SPI flash memory device to terminate the second SPI instruction.

\* \* \* \* \*